United States Patent
Lin et al.

(10) Patent No.: US 7,105,410 B2
(45) Date of Patent: Sep. 12, 2006

(54) CONTACT PROCESS AND STRUCTURE FOR A SEMICONDUCTOR DEVICE

(75) Inventors: Wei-Jye Lin, Pingtung (TW); Ming-Jang Lin, Taichung (TW); Chorng-Wei Liaw, Yunlin (TW)

(73) Assignee: Analog and Power Electronics Corp., Hsinchu (TW)

( * ) Notice: Subject to any disclaimer, the term of this patent is extended or adjusted under 35 U.S.C. 154(b) by 0 days.

(21) Appl. No.: 10/820,743

(22) Filed: Apr. 9, 2004

(65) Prior Publication Data
US 2005/0224869 A1    Oct. 13, 2005

(51) Int. Cl.
*H01L 21/336* (2006.01)
(52) U.S. Cl. .................. 438/270; 438/133; 438/268
(58) Field of Classification Search ............. 438/270, 438/133, 268
See application file for complete search history.

(56) References Cited

U.S. PATENT DOCUMENTS

| 6,551,881 | B1 * | 4/2003 | Letavic ................... 438/267 |
| 6,717,210 | B1 * | 4/2004 | Takano et al. ............ 257/330 |
| 6,818,946 | B1 * | 11/2004 | Venkatraman ............ 257/330 |
| 2005/0035398 | A1 * | 2/2005 | Williams et al. .......... 257/329 |

* cited by examiner

Primary Examiner—W. David Coleman
Assistant Examiner—Su C. Kim
(74) Attorney, Agent, or Firm—Rosenberg, Klein & Lee

(57) ABSTRACT

A contact process for a semiconductor device containing a base region of a first conductivity type formed on a semiconductor substrate comprises formation of a first shallow layer of the first conductivity type on the base region, deposition of an insulator on the first shallow layer, etching the insulator and first shallow layer to form a contact hole, thermally driving the first shallow layer more deeply into said base region, formation of a second shallow layer of a second conductivity type on the base region at the bottom of the contact hole, filling a metal in the contact hole to contact the sidewall of the first shallow layer and the second shallow layer.

10 Claims, 9 Drawing Sheets

CONTACT PROCESS AND STRUCTURE FOR A SEMICONDUCTOR DEVICE

FIELD OF THE INVENTION

The present invention relates generally to a contact process and structure for a semiconductor device, and more particularly, to a contact process and structure for a power MOS device.

BACKGROUND OF THE INVENTION

A conventional contact process for a power MOS device is considerably simple and is performed including heavily doping N+ source and P+ contact region for good ohm contact to reduce the contact resistance between the silicon material of the source and the metal thereof. In this process, the masks to define the N+ region for the source and to define the contact hole are required to overlap well with each other for the formation of good ohm contact.

FIGS. 1A–1G illustrate a conventional contact process for a source contact of an N-type trench power MOSFET. As shown in FIG. 1A, a power MOSFET contains an N– epitaxial layer 12 on an N+ substrate 10, and on the N– epitaxial layer 12, a gate 16 as well as a P-type base region 14 are formed. The contact process comprises defining and implanting an N+ region 18 for the source with a mask 20, and typically, arsenic (As) is implanted thereto and then thermally driven in to diffuse to be the N+ region 18, as shown in FIG. 1B.

Subsequently, as shown in FIG. 1C, an insulator 22 preferably of NSG/BPSG is deposited and annealed. Then, a contact hole 26 is defined with a mask 24 and etched, as shown in FIG. 1D. Afterward, a P+ region 28 is implanted for example with boron difluoride ($BF_2$) through the contact hole 26, as shown in FIG. 1E.

In FIG. 1F, annealing and blanket etching are performed to smooth the insulator 22 and to remove the defective surfaces of the N+ region 18 and the P+ region 28. Finally, metals 30 and 32 are deposited for the source and drain electrodes, as shown in FIG. 1G.

In such structure of a power MOS, the extended length of the N+ junction resulted from the lateral diffusion is nearly the same as the depth thereof by vertically driven in, such that the actual length of the N+ region is much greater than the length defined by the source N+ mask. For the power MOS, in addition to the limitation of the scale down to the unit cell of the power MOS by the longer source N+ region, the current capability of the device itself is reduced, resulting in second breakdown of the trench power MOSFET and latch-up of the insulated-gate bipolar transistor (IGBT).

SUMMARY OF THE INVENTION

It is a primary object of the present invention to propose a contact process and structure for a semiconductor device to reduce the size of the unit cell thereof, as well as to increase the unit density and the current capability of the device.

In a contact process for a semiconductor device containing a base region of a first conductivity type on a semiconductor substrate, according to the present invention, a first shallow layer of the first conductivity type is heavily doped on a surface of the base region, an insulator is deposited on the first shallow layer, a contact hole is etched to extend through the insulator and first shallow layer to expose a sidewall of the first shallow layer and the base region, the first shallow layer is thermally driven in to be more deeply into the base region, a second shallow layer of a second conductivity type opposite to the first conductivity type is formed by heavily doping the exposed surface of the base region at the bottom of the contact hole, and a metal is filled in the contact hole to contact the sidewall of the first shallow layer and the second shallow layer.

In a contact structure for a semiconductor device containing a base region of a first conductivity type on a semiconductor substrate, according to the present invention, a first shallow layer of the first conductivity type is heavily doped on a surface of the base region, an insulator is deposited on the first shallow layer, a contact hole is etched to extend through the insulator and first shallow layer to expose a sidewall of the first shallow layer and the base region, a second shallow layer of a second conductivity type opposite to the first conductivity type is formed by heavily doping the exposed surface of the base region at the bottom of the contact hole, and a metal is filled in the contact hole to contact the sidewall of the first shallow layer and the second shallow layer.

BRIEF DESCRIPTION OF DRAWINGS

These and other objects, features and advantages of the present invention will become apparent to those skilled in the art upon consideration of the following description of the preferred embodiments of the present invention taken in conjunction with the accompanying drawings, in which.

DETAILED DESCRIPTION OF THE INVENTION

Figure 1A:
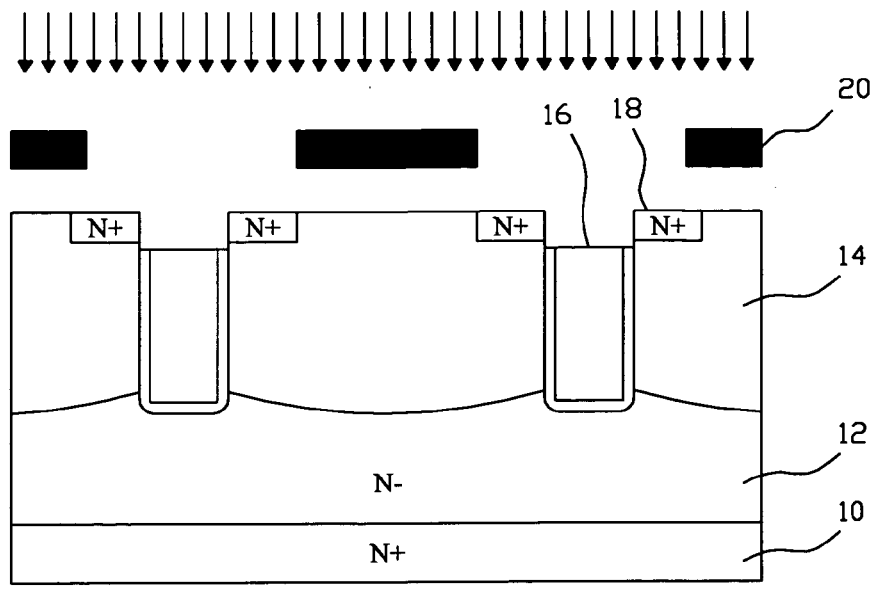
FIGS. 1A–1G illustrate a conventional contact process for a source contact of an N-type trench power MOSFET.
Figure 1B:
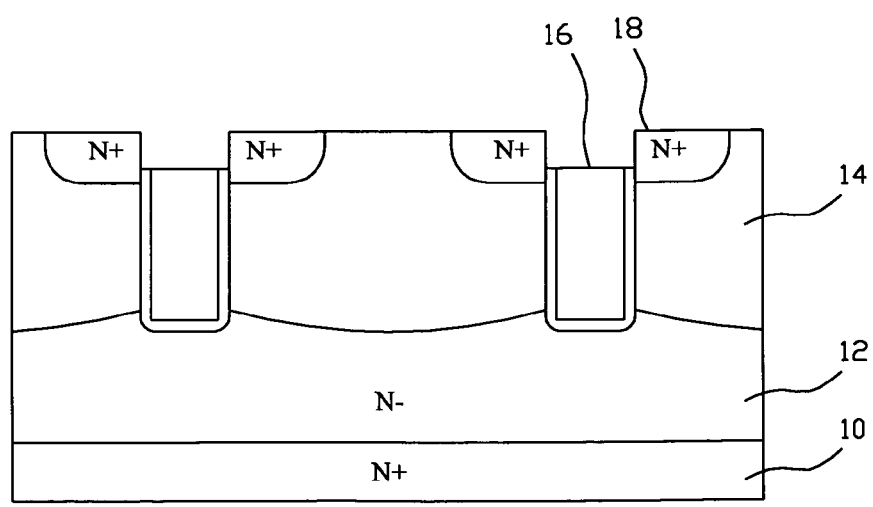
Figure 1C:
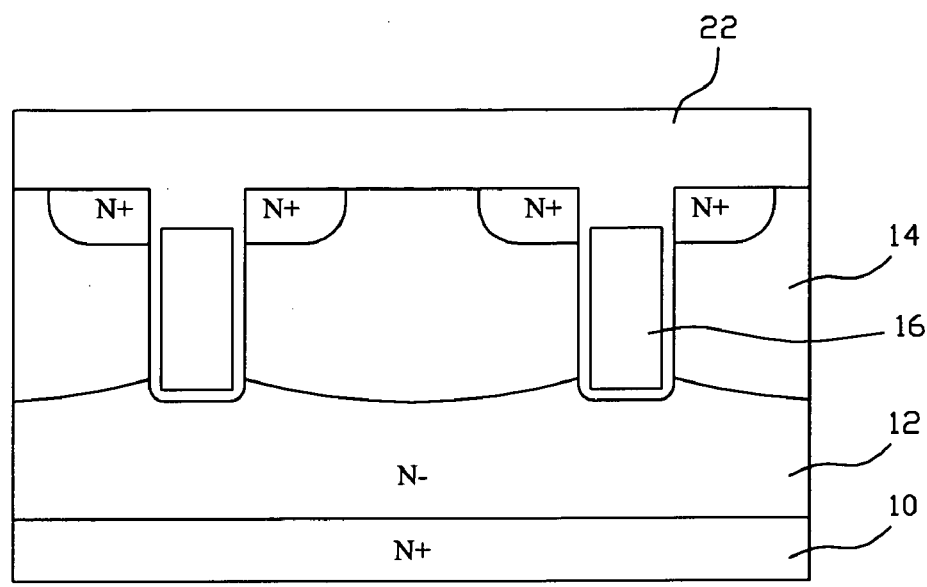
Figure 1D:
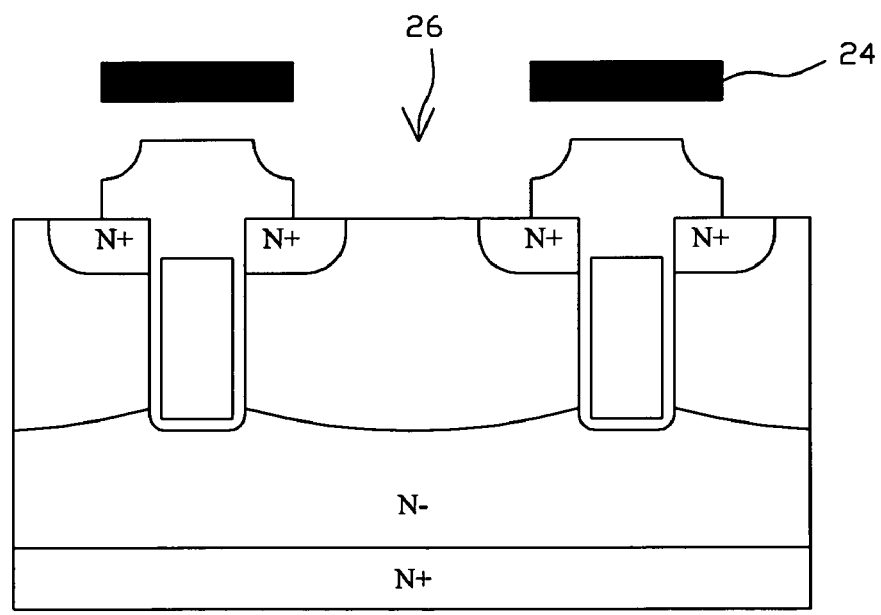
Figure 1E:
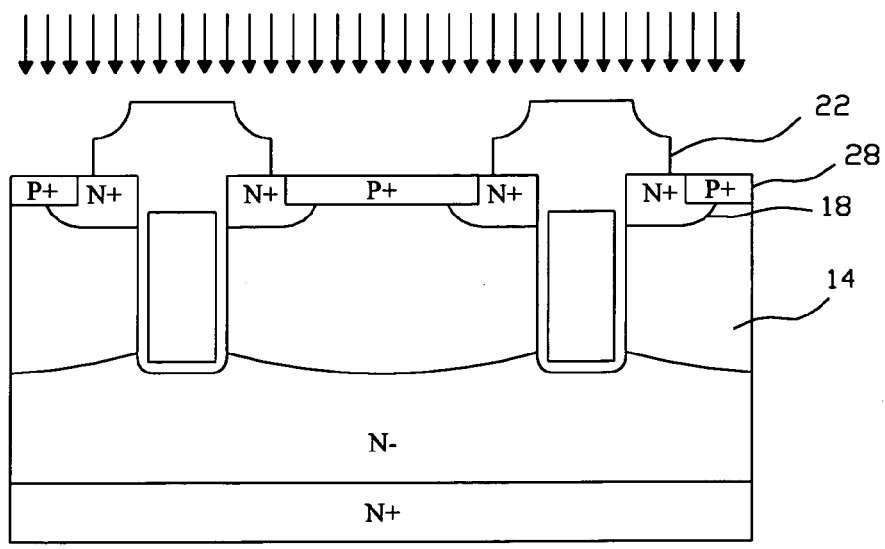
Figure 1F:
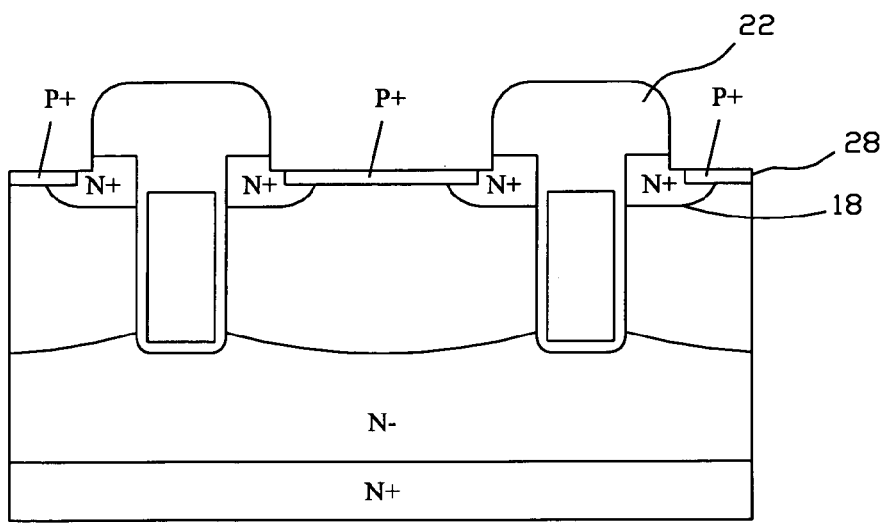
Figure 1G:
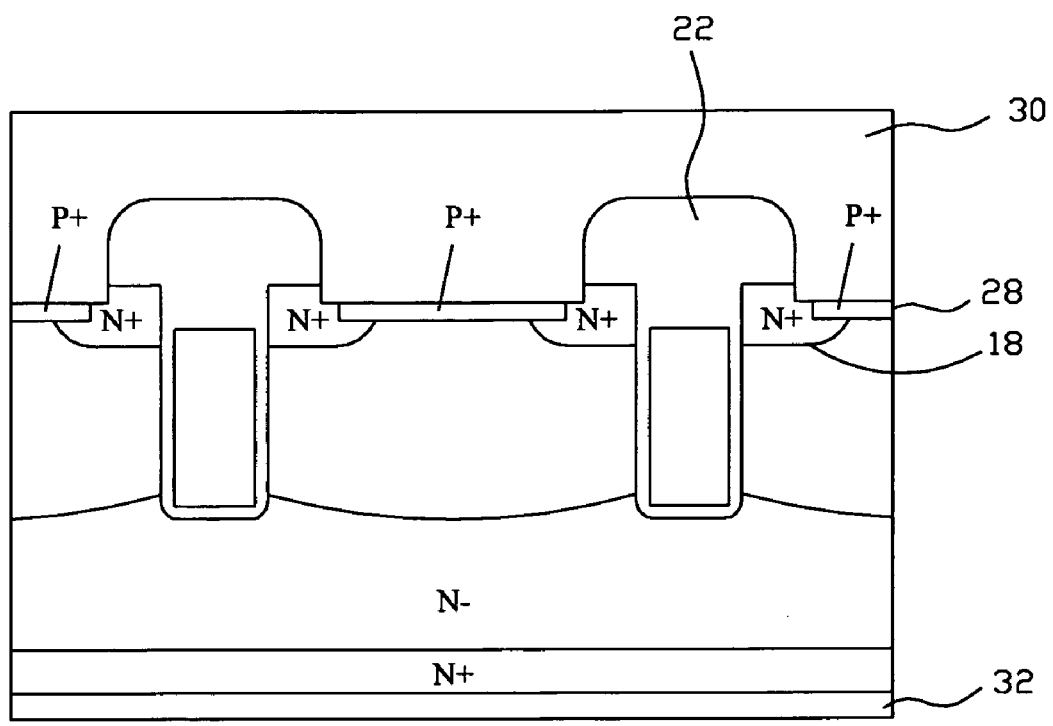
Figure 2A:
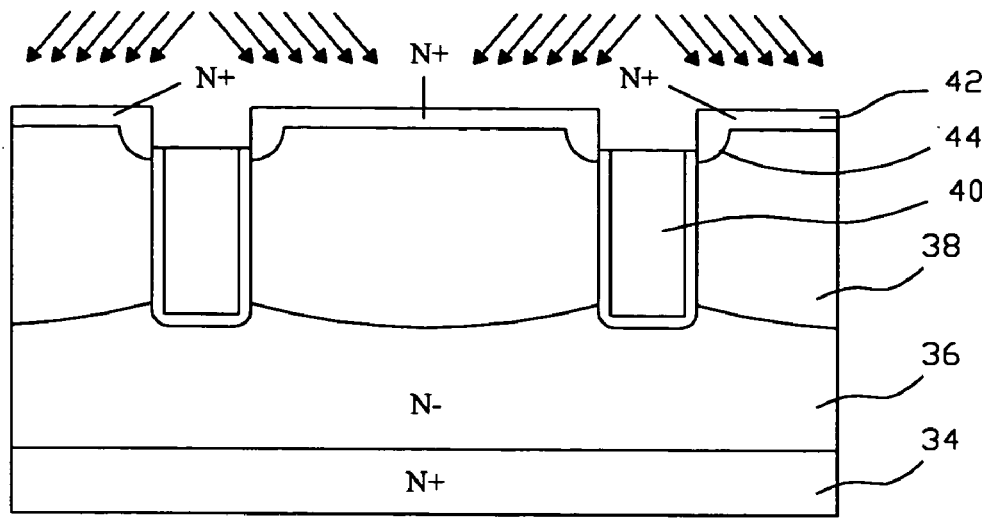
FIGS. 2A–I illustrate a contact process for a source contact of a power MOSFET according to the present invention.
Figure 2B:
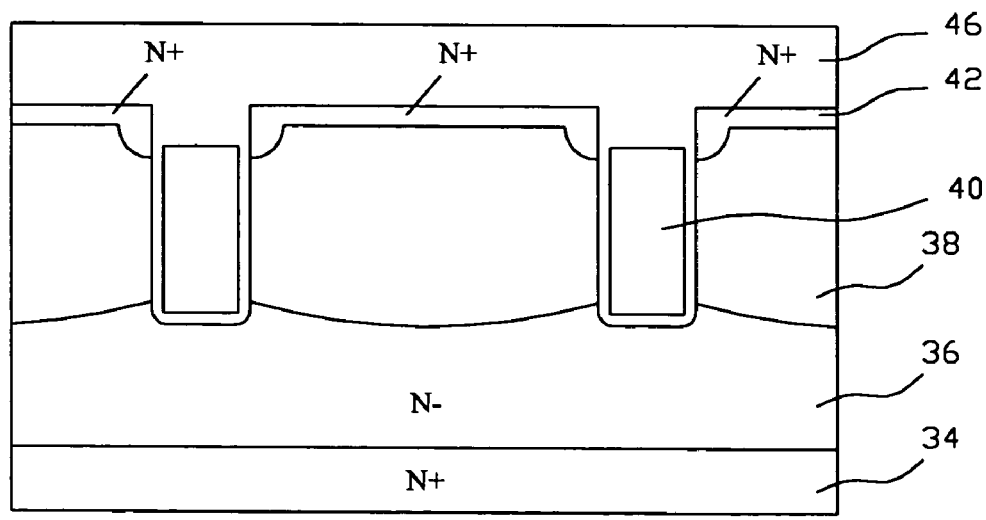

FIGS. 2A–2G illustrate a contact process for a source contact of a power MOSFET according to the present invention. As shown in FIG. 2A, an N– epitaxial layer 36 is formed on an N+ substrate 34, and on the N– epitaxial layer 36, a P-type base region 38 as well as a gate 40 are formed. The contact process of the present invention comprises doping an N+ region 42 for example with arsenic (As) on the P-type base region 38 so as to form a shallow layer. This doping of the N+ region 42 is preferably performed by vertical implantation in conjunction with inclined implantation, and preferably, the inclined angle of the inclined implantation is about 45 degrees to form a pocket 44 at the edge of the gate 40. Next, an insulator 46 is deposited on the N+ region 42 and followed with an annealing treatment, as shown in FIG. 2B. Preferably, the insulator 46 is formed of NSG/BPSG.

Figure 2C:
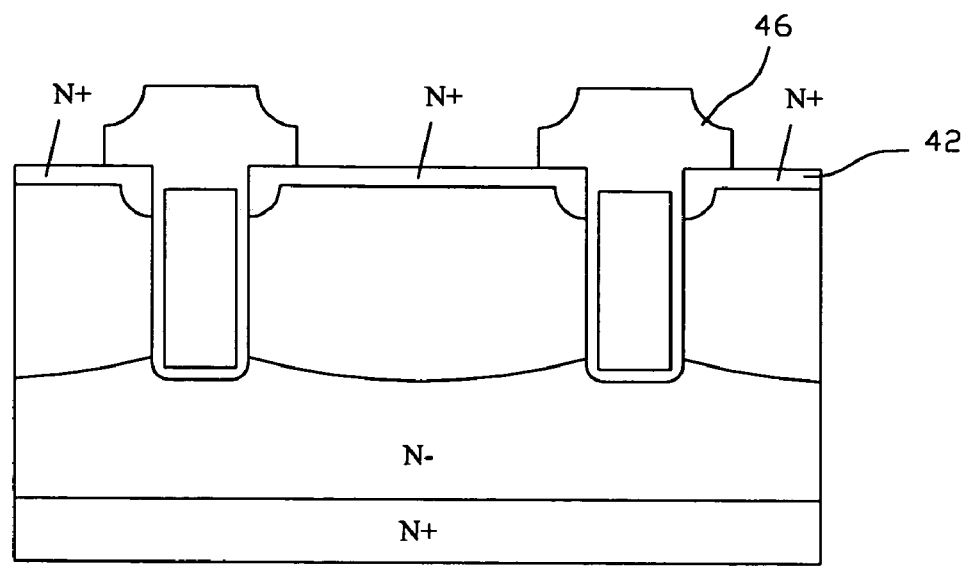
Figure 2D:
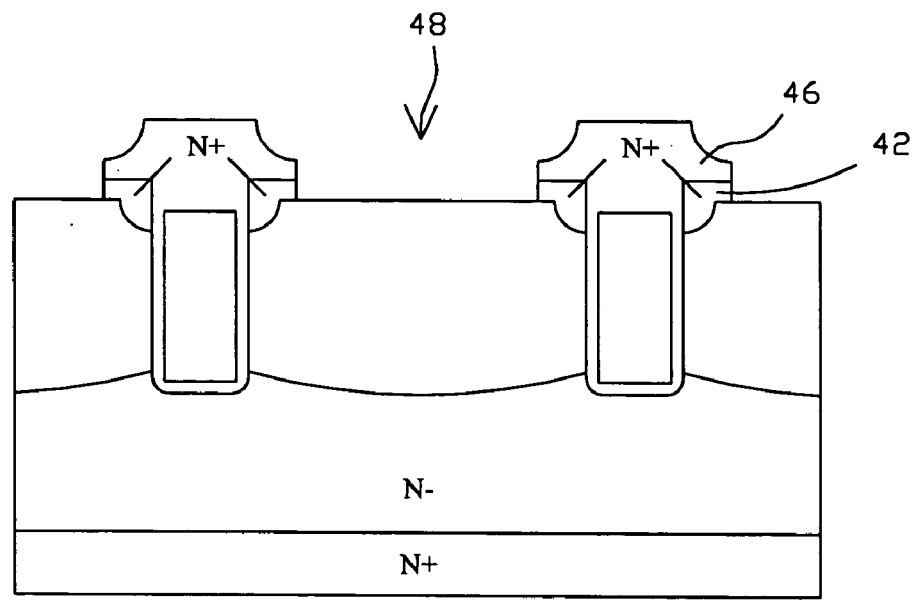

As shown in FIG. 2C, the insulator 46 is etched to form a contact hole 48, and by which, over-etching is applied for the N+ region 42 to be etched away a thickness of about 1000 Å. For the purpose of the subsequent metal deposition quality, the profile of the insulator 46 should be as smooth as possible, and therefore, a wet etching or isotropic etching is applied to the insulator 46 at first, followed by a plasma etching or dry etching to extend the contact hole 48 through the N+ region 42 to reach the base region 38, as shown in FIG. 2D. Preferably, over-etching is applied by prolonging the plasma etching so as to remove the oxide on the surface of the base region 38, and thus the base region 38 has a thickness being etched way. In the etching process, the N+ region 42 could be etched through by the over-etching without changing the etching plant or the gas thereof since the N+ region 42 is a shallow layer. After the formation of the contact hole 48, the base region 38 is exposed again at the bottom of the contact hole 48, and the left N+ region 42 of the shallow layer is also exposed at its sidewall.

Figure 2E:
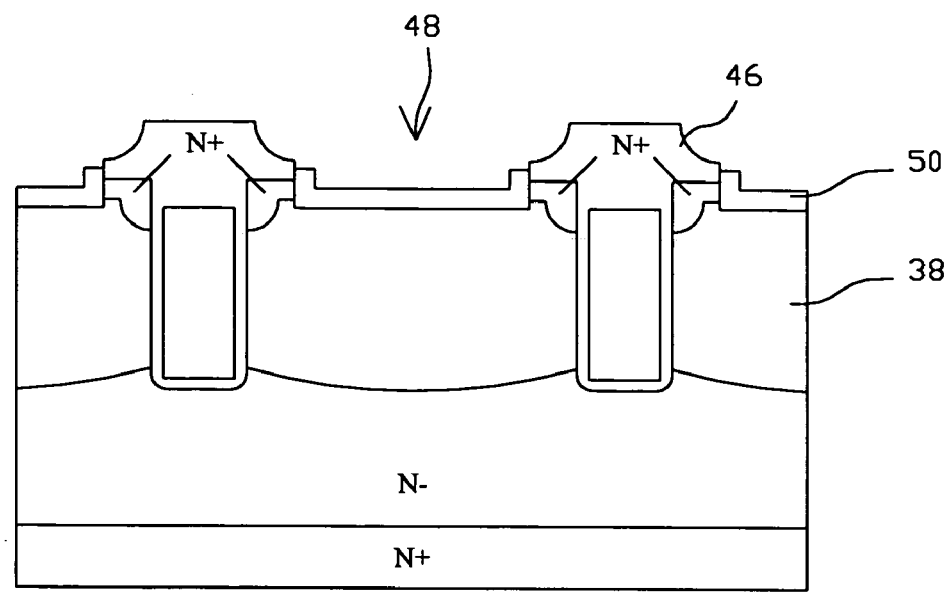

As shown in FIG. 2E, a pad oxide 50 of about 200 Å is further formed, preferably by low-temperature process, on the base region 38 at the bottom of the contact hole 48 so as to block the impurities within the N+ region 42 to outdiffuse. The high-concentration impurities such as phosphorous will outdiffuse from the N+ region 42 into the atmosphere of the chamber during the subsequent thermal drive-in of the N+ region 42, and as a result, the doped concentration of the N+ region 42 is reduced when the N+ region 42 is contacted with metal in later process, such that the contact resistance therebetween is increased. The pad oxide 50 attached to the N+ region 42 will prohibit the outdiffusion from the N+ region 42 during the N+ region 42 is driven-in to be more deeply into the base region 38.

Figure 2F:
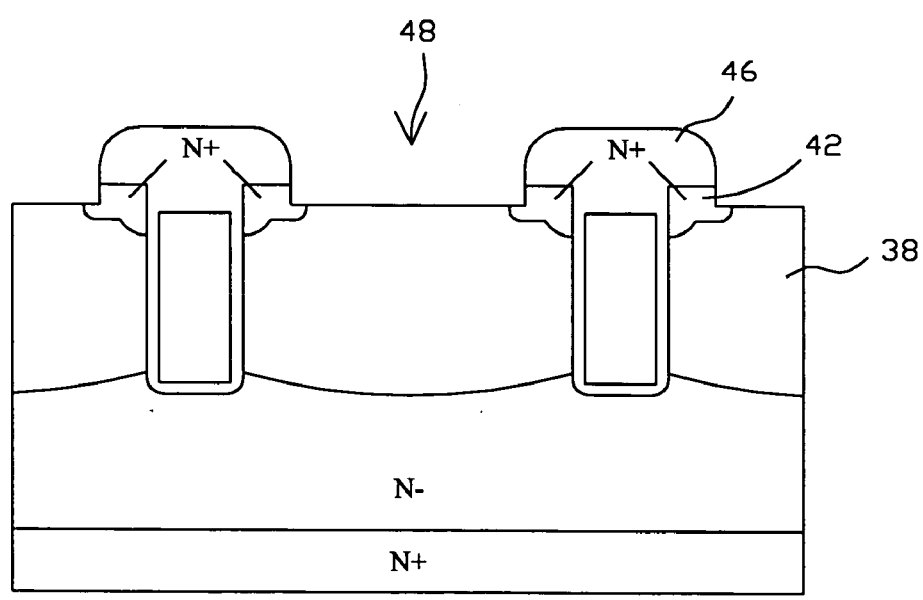

As shown in FIG. 2F, the insulator 46 becomes more smooth after the thermal drive-in process, and after this thermal drive-in of the N+ region 42 performed for the N+ region 42 to be more deeply into the base region 38 by high-temperature diffusion of impurities within the N+ region 42, the pad oxide 50 is removed to expose the base region 38 and the N+ region 42 again. Alternatively, the pad oxide 50 may be remained as a sacrificial layer in the subsequent process and is finally removed by blanket etching.

Figure 2G:
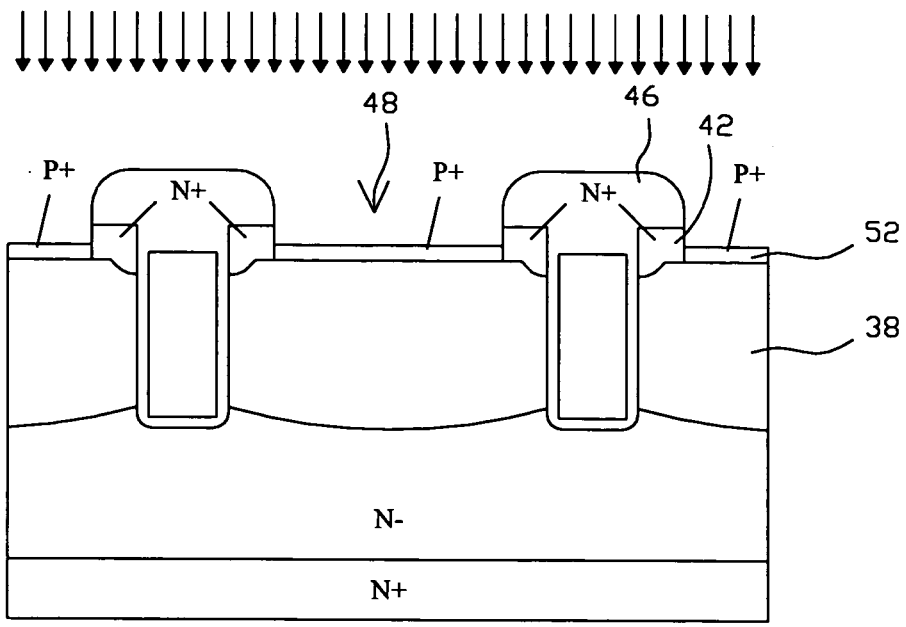
Figure 2H:
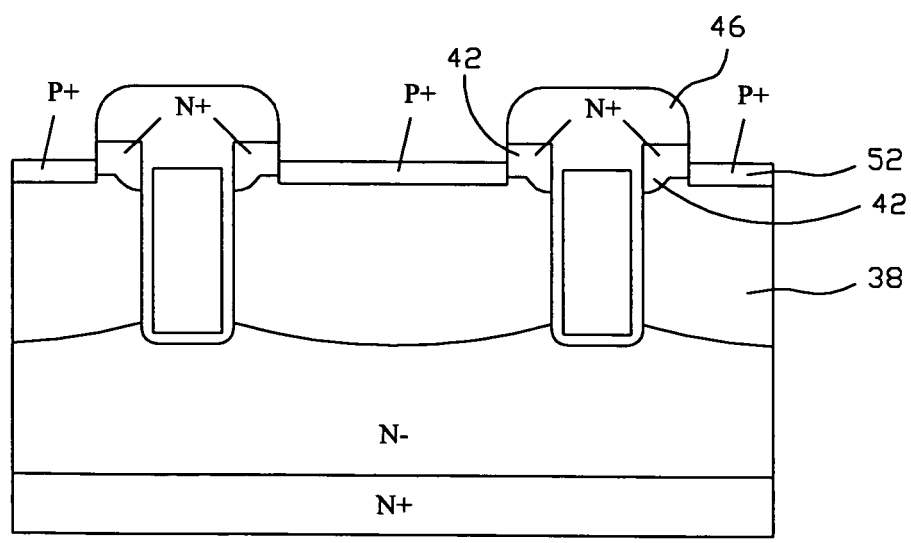
Figure 2I:
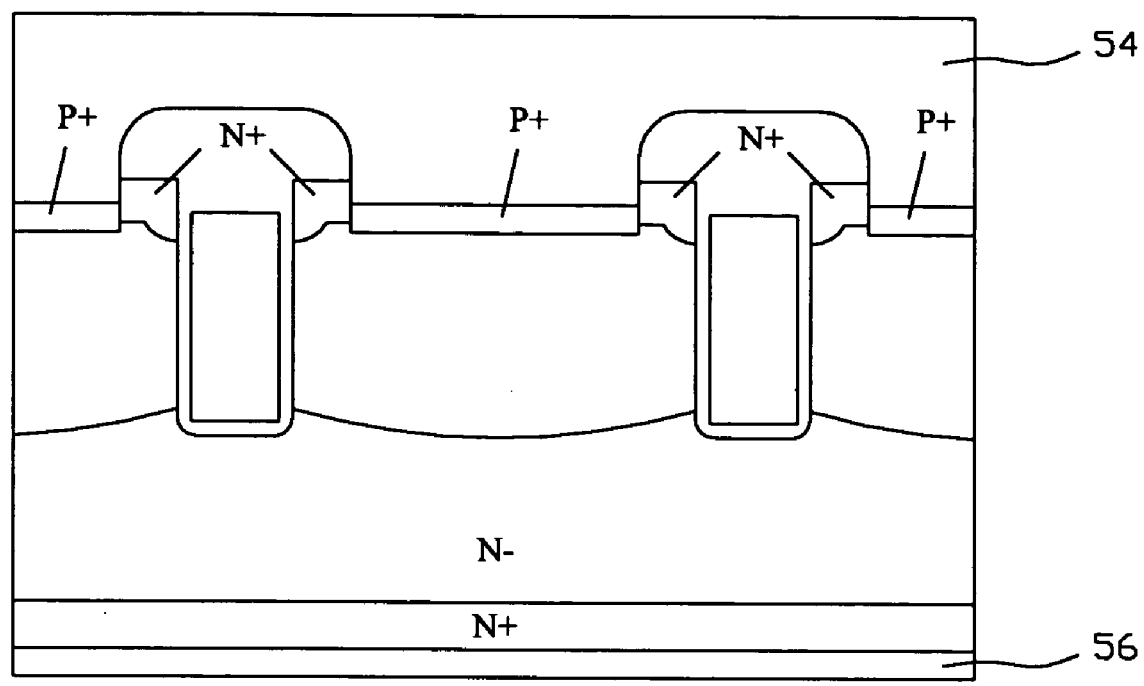

As shown in FIG. 2G, the P-type base region 38 is implanted for example with boron difluoride ($BF_2$) to form a P+ region 52, and subsequently, annealing treatment and blanket etching are performed, as shown in FIG. 2H, in order to remove the defective surface of the P+ region 52 of about 500 Å in thickness. Finally, metals 54 and 56 are deposited for the source and drain electrodes, as shown in FIG. 2I. The metal 54 will be filled in the contact hole 48 so as to contact the P+ region 52 and the sidewall of the N+ region 54.

With the current process, mask, and metal deposition capability, the process according to the present invention avoids the lateral extension of the source resulted from thermal diffusion, as well as the second breakdown effect of the trench power MOSFET and latch-up of the IGBT, thereby decreasing the size of the unit cell thereof, increasing the unit cell density of the device, and reducing one mask and manufacturing cost.

While the present invention has been described in conjunction with preferred embodiments thereof, it is evident that many alternatives, modifications and variations will be apparent to those skilled in the art. Accordingly, it is intended to embrace all such alternatives, modifications and variations that fall within the spirit and scope thereof as set forth in the appended claims.

What is claimed is:

1. A contact process for a semiconductor device containing a base region of a first conductivity type formed on a semiconductor substrate, said contact process comprising the steps of:
   forming at least one gate in said base region;
   after formation of said at least one gate, heavily doping by combined vertical and inclined ion implantation of a dopant into a first surface of said base region containing said at least one gate formed therein for forming on said base region and in juxtaposition with said at least one gate a first shallow layer of a second conductivity type;
   depositing an insulator on said first shallow layer;
   etching said insulator and first shallow layer for forming a contact hole thereof to thereby expose a sidewall of said first shallow layer and a second surface of said base region;
   thermally driving said first shallow layer more deeply into said base region;
   heavily doping said second surface of said base region through said contact hole for forming on said second surface of said base region a second shallow layer of a conductivity type opposite to said second conductivity type of said first shallow layer; and
   filling a metal in said contact hole for contacting said sidewall of said first shallow layer and said second shallow layer.

2. The contact process of claim 1, wherein said inclined ion implantation is performed with an inclined angle of about 45 degrees.

3. The contact process of claim 1, wherein said insulator is etched by a wet etching.

4. The contact process of claim 1, wherein said first shallow layer is etched by a plasma etching.

5. The contact process of claim 4, wherein said plasma etching comprises a vertical over-etching of a thickness of said base region.

6. The contact process of claim 1, further comprising forming a pad oxide on said sidewall of said first shallow layer prior to said thermally driving said first shallow layer so as to prevent said first shallow layer from outdiffusion through said sidewall thereof during said thermally driving said first shallow layer.

7. The contact process of claim 6, wherein said pad oxide is formed by a low-temperature oxide growth.

8. The contact process of claim 1, further comprising an annealing after depositing said insulator.

9. The contact process of claim 1, further comprising an annealing after forming said second shallow layer.

10. The contact process of claim 1, further comprising a blanket etching to said second shallow layer prior to said filling a metal in said contact hole.

\* \* \* \* \*